(12) United States Patent
Chung

(10) Patent No.: US 9,496,265 B2
(45) Date of Patent: Nov. 15, 2016

(54) CIRCUIT AND SYSTEM OF A HIGH DENSITY ANTI-FUSE

(75) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

(21) Appl. No.: 13/314,444

(22) Filed: Dec. 8, 2011

(65) Prior Publication Data

US 2012/0147653 A1   Jun. 14, 2012

Related U.S. Application Data

(60) Provisional application No. 61/421,184, filed on Dec. 8, 2010.

(51) Int. Cl.
| | | |
|---|---|---|
| G11C 17/08 | (2006.01) | |
| H01L 27/10 | (2006.01) | |
| H01L 23/525 | (2006.01) | |
| G11C 17/16 | (2006.01) | |

(52) U.S. Cl.
CPC ............. *H01L 27/101* (2013.01); *G11C 17/16* (2013.01); *H01L 23/5252* (2013.01); *H01L 2924/0002* (2013.01)

(58) Field of Classification Search
None
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A * | 3/1980 | Khan ............... H01L 21/28 148/DIG. 116 |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A * | 10/1999 | Sung ............... H01L 27/1021 257/390 |
| 6,002,156 A | 12/1999 | Lin |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

U.S. Appl. No. 13/471,704, filed Feb. 1, 2011.

(Continued)

*Primary Examiner* — James G Norman

(57) ABSTRACT

A high density anti-fuse cell can be built at the cross points of two perpendicular interconnect lines, such as active region lines, active and polysilicon lines, active and metal lines, or polysilicon and metal lines. The cell size can be very small. At least one of the anti-fuse cells have a thin oxide fabricated before, after, or between a diode in at least one contact holes at the cross points of the interconnect lines. The thin oxide of the anti-fuse cells at the cross points can be selected for rupture by applying supply voltages in the two perpendicular lines. In some embodiments, a diode can be created after thin oxide is ruptured so that explicitly fabricating a diode or opening a contact hole at the cross-point may not be necessary.

21 Claims, 12 Drawing Sheets

(56) References Cited

U.S. PATENT DOCUMENTS

| | | |
|---|---|---|
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 * | 5/2004 | Ooishi .................. G11C 11/16 257/E27.005 |
| 6,770,953 B2 | 8/2004 | Boeck et al. |
| 6,798,684 B2 | 9/2004 | Low et al. |
| 6,803,804 B2 | 10/2004 | Madurawe |
| 6,813,705 B2 | 11/2004 | Duesterwald et al. |
| 6,897,543 B1 | 5/2005 | Huang et al. |
| 6,934,176 B2 | 8/2005 | Low et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,102,951 B2 | 9/2006 | Paillet et al. |
| 7,167,397 B2 | 1/2007 | Paillet et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,369,452 B2 | 5/2008 | Kenkare et al. |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,609,578 B2 | 10/2009 | Buer et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,772,591 B1 | 8/2010 | Shih et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,852,656 B2 | 12/2010 | Shin et al. |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Lu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,680,620 B2 | 3/2014 | Salcedo |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 * | 11/2005 | Ang .................. H01L 27/101 257/306 |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 * | 1/2008 | Scheuerlein ............ G11C 17/16 365/148 |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 * | 5/2008 | Ohara .................. 257/74 |
| 2008/0151612 A1 * | 6/2008 | Pellizzer ............ G11C 11/5678 365/163 |
| 2008/0170429 A1 | 7/2008 | Bertin et al. |
| 2008/0175060 A1 | 7/2008 | Lui et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 * | 12/2009 | Hsia et al. .................. 257/5 |
| 2010/0027326 A1 | 2/2010 | Kim et al. |
| 2010/0061136 A1 | 3/2010 | Koyama et al. |

(56) References Cited

U.S. PATENT DOCUMENTS

| | | |
|---|---|---|
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

U.S. Appl. No. 13/026,650, filed Jan. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/471,704, filed May 15, 2012.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/397,673, filed Feb. 15, 2012.
U.S. Appl. No. 13/571,797, filed Aug. 10, 2012.
U.S. Appl. No. 13/590,044, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Uni-directional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics,"Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.

(56) References Cited

OTHER PUBLICATIONS

Banerjee, Kaustav et al., "High Current Effects in Silicide Films for Sub-0.25um VLSI Technologies," IEEE 36$^{th}$ IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16$^{th}$ Asia and South Pacific, 2011, pp. 197-203.
Cheng, Yu-Hsing et al., "Failure Analysis and Optimization of Metal Fuses for Post Package Trimming," IEEE 45$^{th}$ IRPS, 2007, pp. 616-617.
Chiu, Pi-Feng et al., "A Low Store Energy, Low VDDmin, Non-volatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um$^2$ Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um$^2$ Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39$^{th}$ IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43$^{rd}$ IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7$^{th}$ Annual Non-Volatile Memory Technology Symp, (NVMTS) 2006, pp. 55-57.
Jin, Li-Yan et al., "Low-Area 1-Kb Multi-Bit OTP IP Design," IEEE 8$^{th}$ Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi$^2$ Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

(56) References Cited

OTHER PUBLICATIONS

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um$^2$ 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um$^2$ U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H. Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37$^{th}$ European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18$^{th}$ IEEE Int. Symp. on Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21$^{st}$ Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. ½ Jan./Mar. 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43$^{rd}$ IRPS, 2005, pp. 347-351.

Schrogmeier, P. et al., "Time Discrete Voltage Sensing and Iterative Programming Control for a 4F$^2$ Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded Applications," IEEE Design & Test of Computers, Jan./Feb. 2011, pp. 64-71.

Shi, Min et al., "Zero-Mask Contact Fuse for One-Time-Programmable Memory in Standard CMOS Processes," IEEE Dev. Lett. vol. 32, No. 7, Jul. 2011, pp. 955-957.

(56) References Cited

OTHER PUBLICATIONS

Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large on-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," $33^{rd}$ Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for $Cu_xO$ based RRAM Cell," $9^{th}$ Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/214,198, mailed Jun. 13, 2013.

(56) References Cited

OTHER PUBLICATIONS

Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.

(56) References Cited

OTHER PUBLICATIONS

Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n. Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13/842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
Notice of Allowance for U.S. Appl. No. 13/072,783, mailed May 13, 2015.
Notice of Allowance for U.S. Appl. No. 13/833,067, mailed Jun. 5, 2015.
Office Action for U.S. Appl. No. 13/314,444, mailed Dec. 10, 2014.
Final Office Action for U.S. Appl. No. 13/026,783, mailed Jul. 30, 2015.
Notice of Allowance for U.S. Appl. No. 14/553,874, Aug. 10, 2015.
Office Action for U.S. Appl. No. 14/500,743, mailed Aug. 17, 2015.
Notice of Allowance for U.S. Appl. No. 14/042,392, mailed Aug. 21, 2015.
Office Action for U.S. Appl. No. 14/485,696, mailed Aug. 20, 2015.
Notice of Allowance for U.S. Appl. No. 14/493,083, mailed Aug. 27, 2015.
Office Action for U.S. Appl. No. 13/678,539, mailed Sep. 16, 2015.
Office Action for U.S. Appl. No. 14/507,691, mailed Oct. 30, 2015.
Final Office Action for U.S. Appl. No. 14/101,125, mailed Nov. 17, 2015.
Notice of Allowance for U.S. Appl. No. 13/072,783, mailed Oct. 27, 2015.
Office Action for U.S. Appl. No. 14/792,479, mailed Aug. 28, 2015.
Notice of Allowance for U.S. Appl. No. 14/500,743, mailed Dec. 2, 2015.

* cited by examiner

FIG. 2(a)   FIG. 2(b)

40
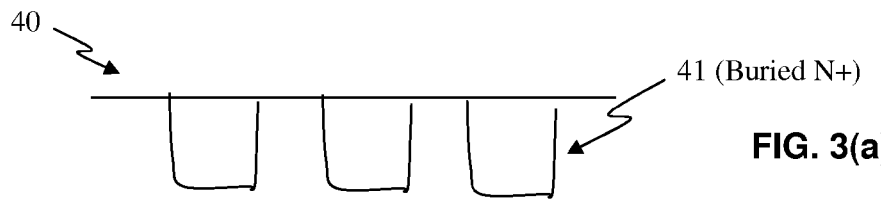
41 (Buried N+)
FIG. 3(a)
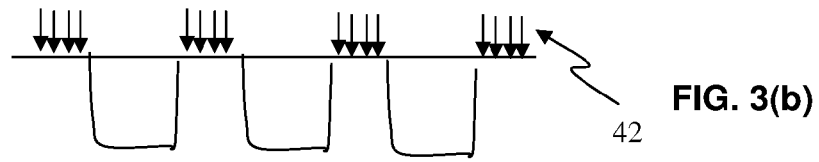
42
FIG. 3(b)
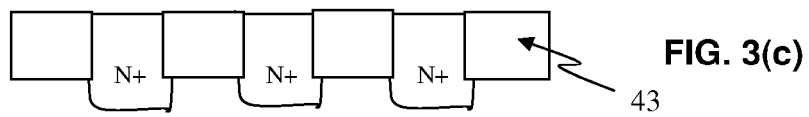
43
FIG. 3(c)
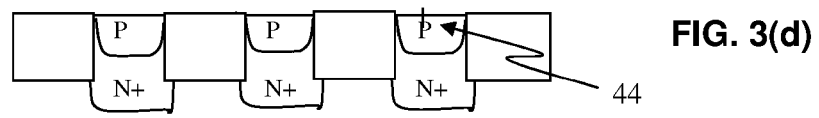
44
FIG. 3(d)
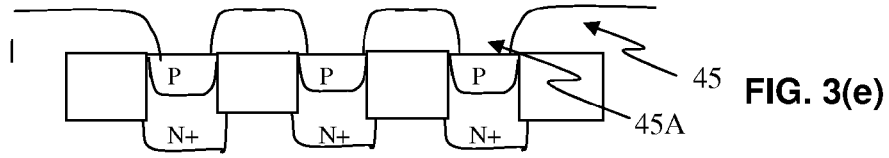
45
45A
FIG. 3(e)
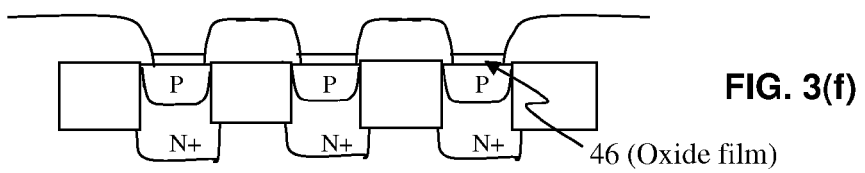
46 (Oxide film)
FIG. 3(f)
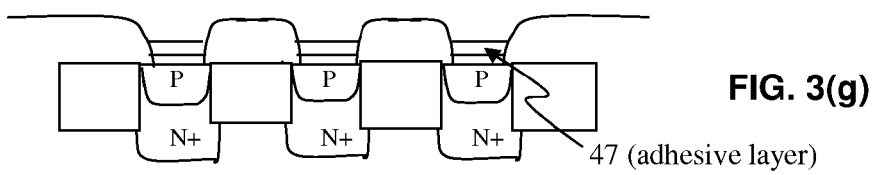
47 (adhesive layer)
FIG. 3(g)
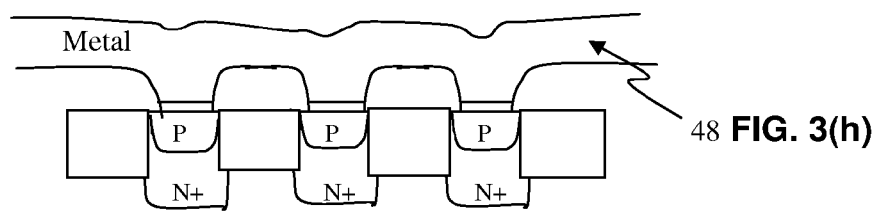
48 FIG. 3(h)

CIRCUIT AND SYSTEM OF A HIGH DENSITY ANTI-FUSE

CROSS-REFERENCE TO RELATED APPLICATION

This application claimed priority benefit of U.S. Provisional Patent Application No. 61/421,184 filed on Dec. 8, 2010, titled "Method and Apparatus of A High Density Anti-fuse," which is hereby incorporated herein by reference.

BACKGROUND OF THE INVENTION

Anti-fuse is one of the One-Time Programmable (OTP) devices that can only be programmed once. Particularly, an anti-fuse has a high impedance state after fabrication and a low impedance state after being programmed. On the contrary, a fuse has a low impedance state after fabrication and a high impedance state after being programmed. The most commonly used anti-fuses are based on MOS gate oxide breakdown, metal-dielectric-metal breakdown, metal-dielectric-silicon breakdown, or silicon-dielectric-silicon breakdown, etc. Silicon dioxide ($SiO_2$) is the most commonly used dielectric for breakdown in anti-fuses. However, Silicon-Oxide-Nitride (SON), Silicon Nitride ($SiN_x$), Oxide-Nitride-Oxide (ONO), or other type of metal oxides, such as Aluminum Oxide ($Al_2O_3$), MgO, $HfO_2$, or $Cr_2O_3$, can also be used.

MOS gate oxide breakdown is based on applying a high voltage to break down the gate oxide to create a programmed state. However, there is a mechanism called soft-breakdown, other than the desirable hard-breakdown, which makes the dielectric film appear to be broken down, but the film may heal by itself after cycling or burn-in. The reliability may be a concern for practical applications.

Dielectric breakdown anti-fuses have been proven in manufacture. One of conventional dielectric breakdown anti-fuse is shown in FIGS. 1(a), 1(b), and 1(c). This anti-fuse is based on metal-dielectric-silicon with a diode constructed by P+ active region over N+ bar as program selector. FIG. 1(a) shows a portion of process steps by using a first Local Oxidation (LOCOS) to define an N+ bar area. FIG. 1(b) shows a second LOCOS step to further define active regions within each N+ bar in a perpendicular direction. The cell is patterned by two LOCOS steps so that the cell size is determined by the pitches of active regions in the X- and Y-directions. The cell size is generally referred to $4F^2$, where F stands for figure size. After the active region of the cells is determined, a P type dopant is implanted, a thin silicon dioxide is grown, and then a metal is built on top of each cell as shown in FIG. 1(c). The equivalent circuit of the anti-fuse cell is a capacitor in series with a diode at an X and Y cross-point as shown in FIG. 1(d). For additional information see, e.g., Noriaki, et. al, "A New Cell for High Capacity Mask ROM by the Double LOCOS Techniques," International Electronics Device Meeting, December, 1983, pp. 581-584.

The anti-fuse cell in FIGS. 1(a), 1(b), and 1(c) is very complicated to fabricate, as it requires three more masks and two LOCOS steps over standard CMOS processes. Fabricating LOCOS requires a mask for field implant, nitride deposition, and a long thermal cycle to grow field oxide. Accordingly, there is a need for an anti-fuse cell that is more compatible with standard CMOS process to save costs.

SUMMARY OF THE INVENTION

The invention pertains to an anti-fuse device and memory based on dielectric breakdown formed at the cross points of two perpendicular conductors that has minimum process steps or masks over standard CMOS logic processes.

The general structures of the devices in this invention has a dielectric film for rupture and a diode as program selector in a cell defined at a cross-point of two conductor (conductive) lines in perpendicular directions. There are various embodiments that are within the scope and spirit of this invention. The dielectric film can be fabricated from silicon dioxide ($SiO_2$), silicon nitride ($SiN_x$, or $Si_3N_4$ particularly), silicon oxide-nitride (SON), or silicon oxide-nitride-oxide (ONO). Alternatively other types of metal oxides, such as $Al_2O_3$, $HfO_2$, MgO, $ZrO_2$, or $Cr_2O_3$, can be used, but they may be more expensive, difficult to manufacture, and have a higher breakdown voltage. The diode can be a junction diode constructed from bulk silicon, a diode constructed from polysilicon, a diode constructed from bulk silicon and polysilicon, or a p-i-n diode with an intrinsic layer between P and N type silicon or polysilicon. An intrinsic layer means it is not intentionally P or N doped but can be slightly N or P type due to out-diffusion or contamination. The dielectric film may be fabricated before, after, or between the N or P terminals of the diode. The conductors in perpendicular directions can be both active regions, active and polysilicon, polysilicon and metal, or active and metal, in various embodiments. The cross point may be formed at the junction of two perpendicular conductors, or inside a contact hole at the junction of two perpendicular conductors.

Another key concept of this invention is to use core logic or I/O devices in the peripheral of the anti-fuse memory that are the same devices as those built in the rest of integrated circuits. In the past, the programming voltage of an anti-fuse is very high, about 12V or 18V, that needs special high voltage devices in the peripheral circuit to design an anti-fuse memory. As a result, more mask layers and more process steps are needed, and hence the fabrication costs are very high. One aspect of this invention can eliminate the need to use high voltage devices to lower the breakdown voltage of the dielectric film so that core or I/O devices in an integrated circuit can be used. Another embodiment is to use a combination of different voltages in two perpendicular conductors to achieve high voltage for a selected cell to program, while the unselected cells are operated within a low voltage range.

Though there are many different and useful embodiments of the invention, the size of the anti-fuse can be $4F^2$, where F stands for figure size that is the width or space of the conductors to form an anti-fuse cell. It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

The invention can be implemented in numerous ways, including as a method, system, device, or apparatus (including graphical user interface and computer readable medium). Several embodiments of the invention are discussed below.

As an anti-fuse memory, one embodiment can, for example, include a plurality of anti-fuse cells. At least one of the anti-fuse cells can include a dielectric film coupled to a first supply voltage line, and a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can also be coupled to the dielectric film, and the second type of silicon can be coupled to a second supply voltage line. The first and second type of silicon can be fabricated at the cross points of two perpendicular conductor lines. The conductor lines can be implemented by any combinations of metal, active region, buried layer, or polysilicon. The diode can be constructed explicitly or by itself after oxide breakdown. If one of the conductor lines is metal while the other is an active region, buried layer, or polysilicon, a diode can built explicitly in the active region, buried layer or polysilicon with a first and a second type of silicon. If the two perpendicular conductor lines are buried layer and polysilicon with a first and second type of silicon, respectively, a diode can be constructed by itself once the oxide film is broken down. The dielectric film can be configured to be programmable by applying voltages to the first and second supply voltage lines to thereby change the resistance of the dielectric film into a different logic state. Alternatively, the dielectric film can be coupled to the second type of silicon, or in between the first and the second type of silicon in other embodiments.

As an electronic system, one embodiment can, for example, include at least a processor, and an anti-fuse memory operatively connected to the processor. The anti-fuse memory can include at least a plurality of anti-fuse cells for providing data storage. Each of the anti-fuse cells can include at least a dielectric film coupled to a first supply voltage line, and a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can be coupled to the dielectric film and the second type of silicon can be coupled to a second supply voltage line. The first and second type of silicon can be fabricated at the cross points of two perpendicular conductor lines. The conductor lines can be implemented by any combinations of metal, active region, buried layer, or polysilicon. The diode can be constructed explicitly or by itself after oxide breakdown. If one of the conductor lines is metal while the other is an active region, buried layer, or polysilicon, a diode can be built explicitly in the active region, buried layer or polysilicon with a first and a second type of silicon. If the two perpendicular conductor lines are buried layer and polysilicon with a first and second type of silicon, respectively, a diode can be constructed by itself once the oxide film is broken down. The dielectric film can be configured to be programmable by applying voltages to the first and the second supply voltage lines to thereby change the resistance of the dielectric film into a different logic state. Alternatively, the dielectric film can be coupled to the second type of silicon, or in between the first and the second type of silicon in other embodiments.

As a method for providing an anti-fuse memory, one embodiment can, for example, include at least providing a plurality of anti-fuse cells, and programming a logic state into at least one of the anti-fuse cells by applying voltages to the first and the second voltage lines. The at least one of the anti-fuse cells can include at least (i) a dielectric film coupled to a first supply voltage line, and (ii) a diode including at least a first type of silicon and a second type of silicon. The first type of silicon can have a first type of dopant and the second type of silicon can have a second type of dopant. An intrinsic layer may be inserted between the first and the second types of silicon. The first type of silicon can provide a first terminal of the diode and the second type of silicon can provide a second terminal of the diode. The first type of silicon can be coupled to the dielectric film and the second type of silicon can be coupled to a second supply voltage line. The first and second type of silicon can be fabricated at the cross points of two perpendicular conductor lines. The conductor lines can be any combinations of metal, active region, buried layer, or polysilicon. The diode can be constructed explicitly or by itself after oxide breakdown. If one of the conductor lines is metal while the other is an active region, buried layer, or polysilicon, a diode can be built explicitly in the active region, buried layer or polysilicon with a first and a second type of silicon. If the two perpendicular conductor lines are buried layer and polysilicon with a first and second type of silicon, respectively, a diode can be constructed by itself once the oxide film is broken down. The dielectric film can be configured to be programmable by applying voltages to the first and the second supply voltage lines to thereby change the resistance of the dielectric film into a different logic state. Alternatively, the dielectric film can be coupled to the second type of silicon, or in between the first and the second type of silicon in other embodiments.

As an electronic system, one embodiment can, for example, include at least a battery and an integrated circuit operatively connected to the battery. The at least one battery can provide a voltage between 1.0 and 2.0V in the nominal conditions. The integrated circuit can include at least an anti-fuse memory including at least a plurality of anti-fuse cells. Each of at least the plurality of the anti-fuse cells can be constructed at one of the cross points and each of at least the plurality of anti-fuse cells can include at least: (i) a plurality of conductive lines with a first type of dopant; (ii) a plurality of metal lines being substantially perpendicular to the polysilicon lines; (iii) a layer of isolation oxide fabricated between the metal and conductive lines; (iv) a plurality of contacts being open at the cross points of metal and conductive line; and (v) a silicon diode and a layer of thin oxide fabricated in each contact hole before placing metal lines. The anti-fuse memory can be configured to be selectively programmable by applying a first supply voltage to the metal lines and a second supply voltage to the conductive lines to rupture the thin oxide.

BRIEF DESCRIPTION OF THE DRAWINGS

The present invention will be readily understood by the following detailed descriptions in conjunction with the accompanying drawings, wherein like reference numerals designate like structural elements, and in which:

FIG. 2(a) shows a top view of a dielectric-breakdown anti-fuse defined by active regions in X- and Y-directions according to one embodiment.

FIG. 2(b) shows a cross section of a dielectric-breakdown anti-fuse defined by active regions in the Y direction.

FIG. 3(a) shows step (a) of fabricating a dielectric-breakdown anti-fuse defined by active regions (ref. FIG. 2(a)-2(c)) after buried N+ layer.

FIG. 3(b) shows step (b) of fabricating a dielectric-breakdown anti-fuse defined by active regions (ref. FIG. 2(a)-2(c)) after field implant.

FIG. 3(c) shows step (c) of fabricating a dielectric-breakdown anti-fuse defined by active regions (ref. FIG. 2(a)-2(c)) after building isolation for active regions.

FIG. 3(d) shows step (d) of fabricating a dielectric-breakdown anti-fuse defined by active regions (ref. FIG. 2(a)-2(c)) after a P+ implant as the P terminal of a diode.

FIG. 3(e) shows step (e) of fabricating a dielectric-breakdown anti-fuse defined by active regions (ref. FIG. 2(a)-2(c)) after growing an interlayer dielectric and etching contact holes.

FIG. 3(f) shows step (f) of fabricating a dielectric-breakdown anti-fuse defined by active regions (ref. FIG. 2(a)-2(c)) after depositing a thin layer of dielectric for breakdown.

FIG. 3(g) shows step (g) of fabricating a dielectric-breakdown anti-fuse defined by active regions (ref. FIG. 2(a)-2(c)) after depositing an adhesive layer.

FIG. 3(h) shows step (h) of fabricating a dielectric-breakdown anti-fuse defined by active regions (ref. FIG. 2(a)-2(c)) after depositing, patterning, and etching a metal layer.

FIG. 4) after depositing and siliciding polysilicon.

FIG. 4) after growing an interlayer dielectric and etching contact holes.

FIG. 4) after depositing an adhesive layer.

FIG. 4) after growing a p-i-n silicon diode inside a contact hole.

FIG. 4) after growing an oxide film on top of a silicon diode.

FIG. 4) after depositing another adhesive layer.

FIG. 4) after depositing, patterning, and etching a metal layer.

FIG. 9) after building buried N+ lines and depositing gate oxide.

FIG. 9) after stripping the gate oxide and depositing P type polysilicon.

FIG. 9) after depositing interlayer dielectric, opening contact holes, and deposit an adhesive layer.

FIG. 9) after growing or depositing an oxide film.

FIG. 9) after depositing another adhesive layer.

FIG. 9) after depositing, patterning, and etching a metal layer.

DETAILED DESCRIPTION OF THE INVENTION

This invention concerns a dielectric breakdown anti-fuse cell using diode as program selector defined at a cross-point of two conductor lines in perpendicular directions. Various embodiments about dielectric materials, diode structures, conductor types, process steps, devices employed, and cell select schemes will be disclosed and that are within the scope of this invention.

FIG. 2(a) shows a top view of a dielectric breakdown anti-fuse 10 according to one embodiment. Each anti-fuse cell 15 is defined by active regions in X- and Y-directions. An array of buried N+ lines 11 serve as wordlines are built running in the X-direction before active regions 12 is defined. The active regions can be isolated in X- and Y-directions by Local Oxidation (LOCOS) or Shallow Trench Isolation (STI). A contact hole 13 in each active region is etched after depositing an interlayer dielectric. Then, N type and P type dopants are subsequently implanted into the contact hole in each active region to act as N and P terminals of a diode. A thin film of dielectric, such as $SiO_2$, $Si_3N_4$, $SiN_x$, silicon-oxide-nitride (SON), or silicon oxide-nitride-oxide (ONO), is deposited or grown into each contact hole for rupture by programming. A metal is built on top of the contact hole to serve as a bitline.

Figure 1A:
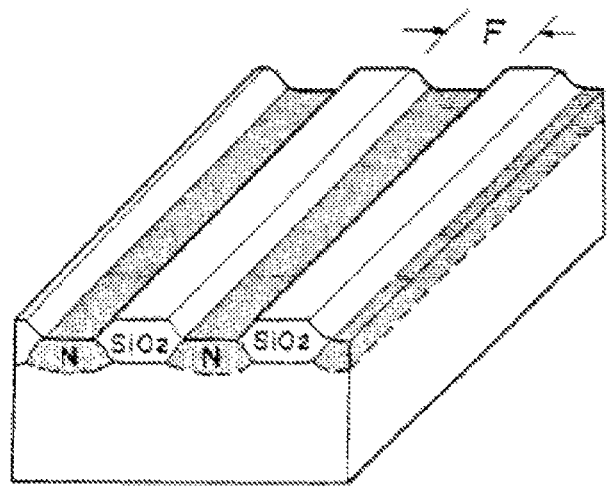
FIG. 1(a) shows a first LOCOS step in a conventional dielectric breakdown anti-fuse.
Figure 1B:
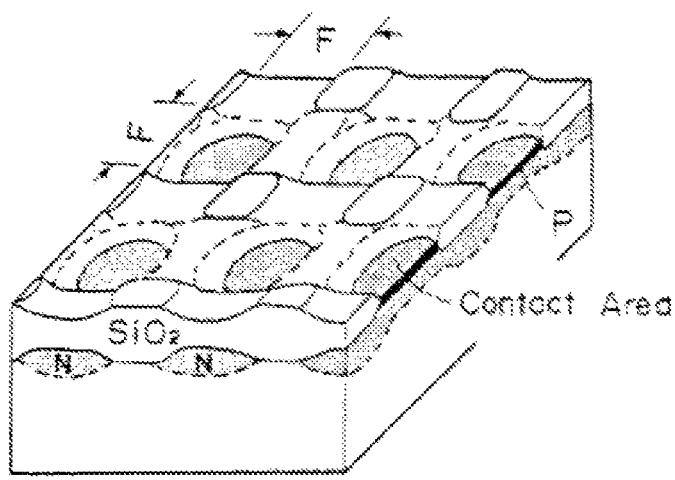
FIG. 1(b) shows a second LOCOS step in a conventional dielectric breakdown anti-fuse.
Figures 1C, 1D:
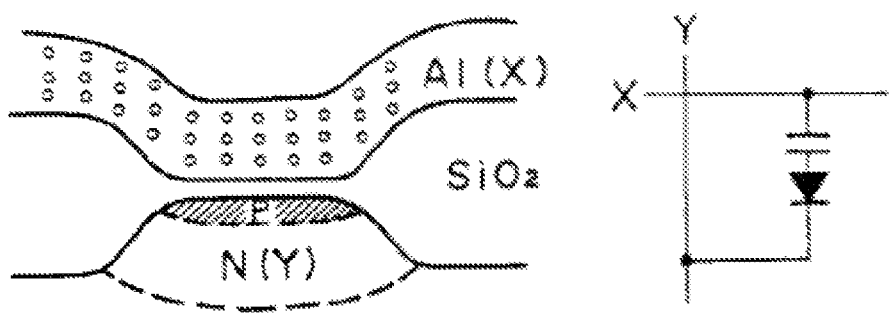
FIG. 1(c) shows a cross section of a conventional metal-oxide-silicon anti-fuse using a diode as program selector.
FIG. 1(d) shows a conventional equivalent circuit of the anti-fuse cell.
Figure 2C:
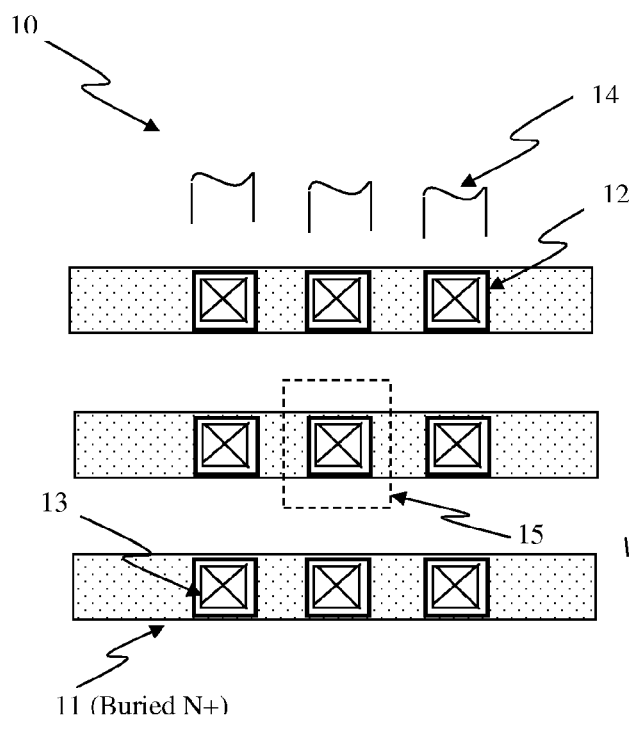
FIG. 2(c) shows a cross section of a dielectric-breakdown anti-fuse defined by active regions in the X direction.
Figure 2C:
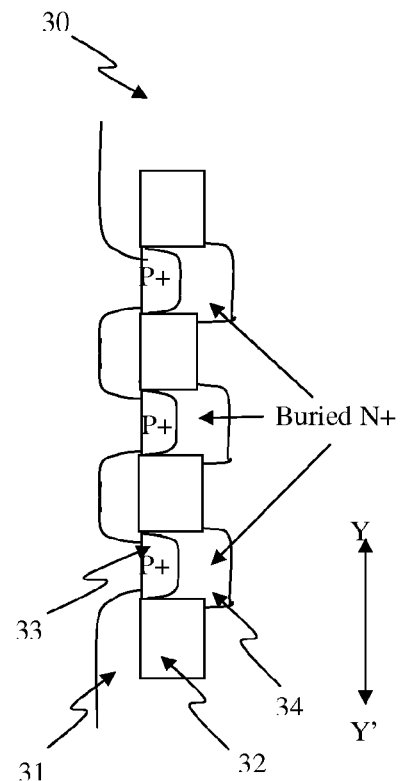
Figure 2C:
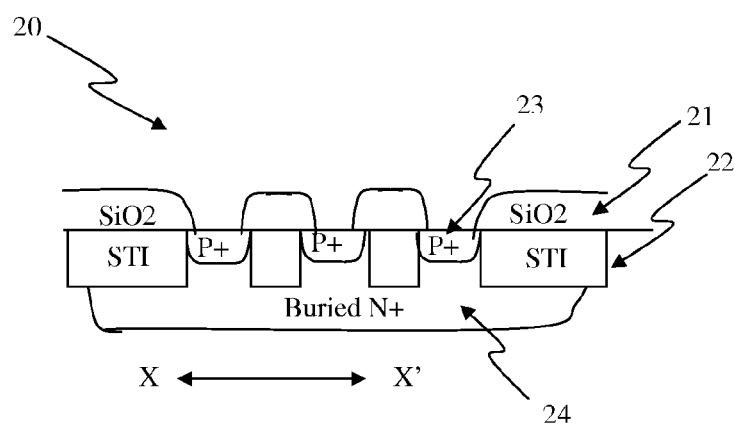

FIG. 2(b) shows a cross section 30 of the dielectric breakdown anti-fuse in FIG. 2(a) along the Y-direction. Buried N+ lines 34 between LOCOS or STI 32 connect active regions along the X-direction and also serve as the N terminal of each diode. The N+ lines should be deeper than the isolation between active regions. Then, an interlayer dielectric 31 (normally silicon dioxide) is deposited to isolate the active regions from the upper conductor layers and then contact holes are etched. Each contact hole is implanted with P+ 33, the same implant for source and drain of PMOS devices, to serve as the P terminal of a diode. FIG. 2(c) shows a cross section 20 of the same dielectric breakdown anti-fuse in FIGS. 2(a) and 2(b) along the X-direction. Buried N+ lines 24 between LOCOS or STI 22 connect active regions along the X-direction and also serve as the N terminal of each diode. Then, the interlayer dielectric 21 (normally silicon diode) is deposited to isolate the active regions from the upper conductor layers and then contact holes are etched. Each cell is implanted with P+ 23, the same implant for sources or drains of PMOS devices, to serve as the P terminal of a diode. The N+ lines can be fabricated in one or two steps. The first step is to implant a heavy N+ line deep into the silicon to connect the cells in the X-direction, and then a second shallower N type dopant is implanted into each cell to reach the deep N+ line and to serve as the N terminal of a diode.

FIGS. 3(a)-3(h) show cross sections 40 in a portion of process steps related to the dielectric breakdown anti-fuse shown in FIG. 2(a)-2(c). The cross sections are shown along the Y-direction. FIG. 3(a) shows a cross section after buried N+ lines 41 are implanted and annealed. The N+ lines 41 act as the N terminals of a diode in each cell, interconnect the cells in the X-direction, and serve as wordlines. The N+ lines shall be deeper than the isolation for active regions and can be heavily doped near the bottom. The desirable embodiment for N+ lines is a shallow retrograde N well, similar to the N well in common CMOS processes. FIG. 3(b) shows a field implant 42 before growing thermal oxide in LOCOS or etching shallow trenches in STI process. FIG. 3(c) shows after active region isolations 43, either LOCOS or STI, are built. Alternatively, the buried N+ 41 in FIG. 3(a) can be implanted into silicon after LOCOS or STI 43 is formed in FIG. 3(c). FIG. 3(d) shows after a P+ implant 44, the same as source or drain implant of a PMOS, to act as the P terminal of the diode in each cell. FIG. 3(e) shows after an interlayer dielectric 45 is deposited and contact holes 45A are etched. FIG. 3(f) shows after a thin oxide film 46 is deposited for rupture upon programming. The thickness of the $SiO_2$ is generally around 30-80 Å to have breakdown voltage about 6-15V. FIG. 3(g) shows after an adhesive layer 47 is deposited to provide a better attachment for metal on top. The adhesive layer can be a 200 Å TiN film or other material. FIG. 3(h) shows after a metal layer 48 is deposited, patterned, and then etched. Two additional masks may be needed: one for defining and building N+ lines and the other for growing a dielectric film for breakdown.

Figure 4:
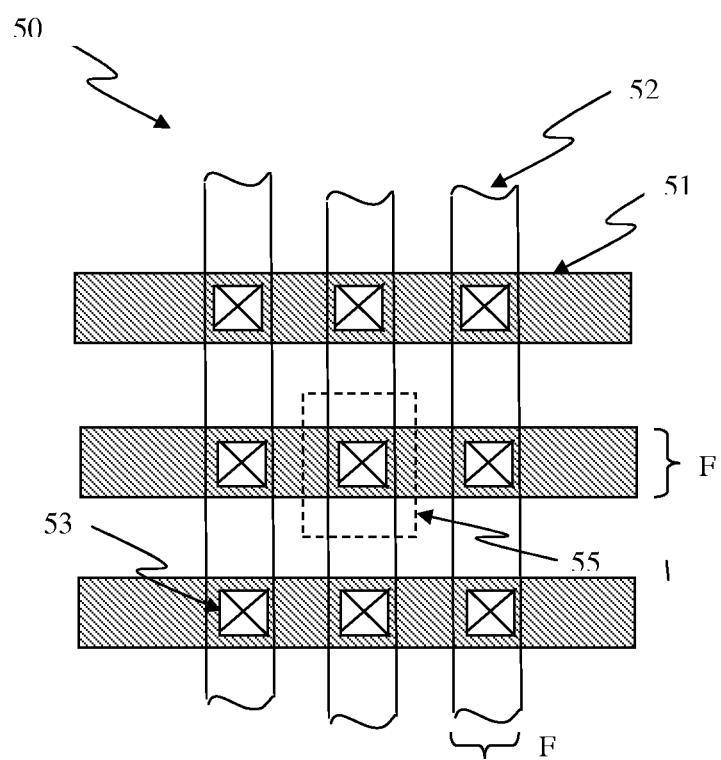
FIG. 4 shows a top view of another embodiment of dielectric breakdown anti-fuse defined by metal and polysilicon according to one embodiment.

FIG. 4 shows a top view of dielectric breakdown anti-fuse cells 50 defined by metal lines 52 and polysilicon lines 51 according to embodiment. Inside each contact hole 53 at the junctions of the polysilicon lines 51 and metal lines 52 builds an anti-fuse cell 55. The cell size is determined by metal pitch in the X-direction and polysilicon pitch in the Y-direction so that the cell size is $4F^2$.

Figure 5A:
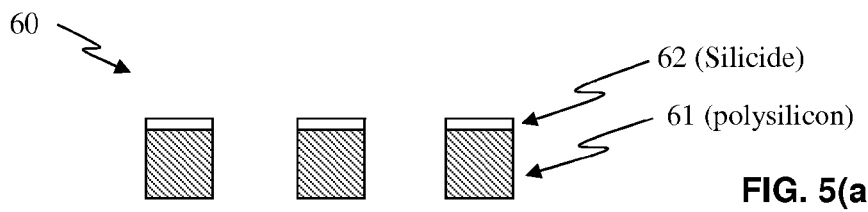
FIG. 5(a) shows step (a) of fabricating a dielectric breakdown anti-fuse defined by metal and polysilicon (ref.
Figure 5B:
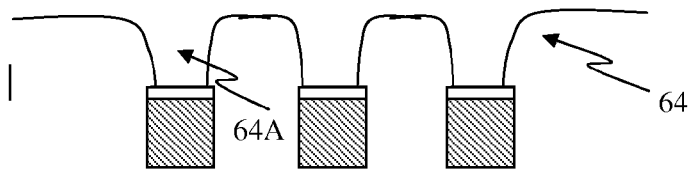
FIG. 5(b) shows step (b) of fabricating a dielectric-breakdown anti-fuse defined by metal and polysilicon (ref.
Figure 5C:
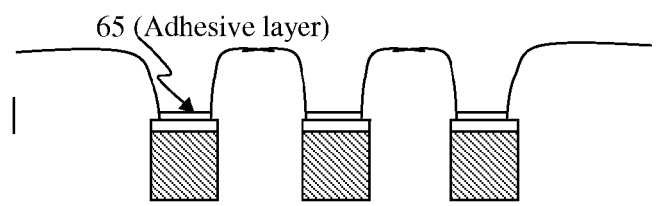
FIG. 5(c) shows step (c) of fabricating a dielectric-breakdown anti-fuse defined by metal and polysilicon (ref.
Figure 5D:
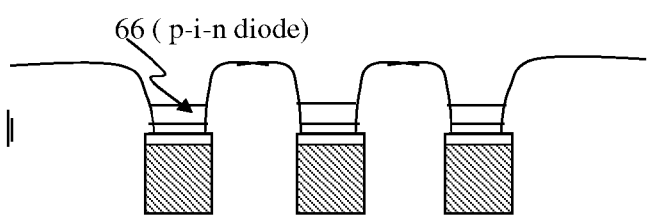
FIG. 5(d) shows step (d) of fabricating a dielectric-breakdown anti-fuse defined by metal and polysilicon (ref.
Figure 5E:
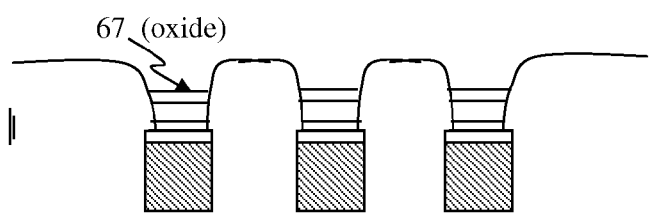
FIG. 5(e): shows step (e) of fabricating a dielectric-breakdown anti-fuse defined by metal and polysilicon (ref.
Figure 5F:
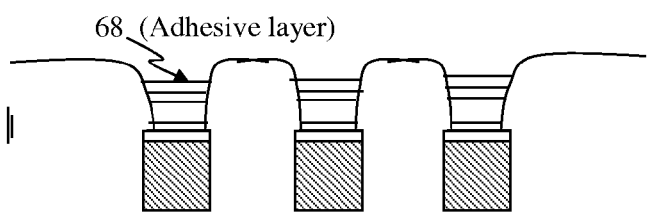
FIG. 5(f): shows step (f) of fabricating a dielectric-breakdown anti-fuse defined by metal and polysilicon (ref.
Figure 5G:
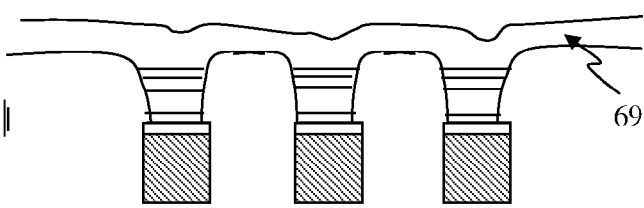
FIG. 5(g): shows step (g) of fabricating a dielectric-breakdown anti-fuse defined by metal and polysilicon (ref.

FIGS. 5(a)-5(g) show cross sections 60 in a portion of process steps related to the dielectric breakdown anti-fuse defined by metal and polysilicon in FIG. 4. The cross sections are along the Y-direction. FIG. 5(a) shows a cross section after polysilicon lines 61 are built and silicide 62 is grown on top. The polysilicon lines interconnect the cells in the X-direction, and serve as wordlines. The silicide on top reduces resistance of the polysilicon lines. FIG. 5(b) shows after an interlayer dielectric 64 is deposited and contact holes 64A are etched therein. FIG. 5(c) shows after an adhesive layer 65 is deposited in the contact holes. FIG. 5(d) shows after a silicon diode 66 is built with N type, intrinsic, and P type dopants. The diode can be fabricated by Chemical Vapor Deposition (CVD) with dopants changed in situ, (i.e. dopants changed from N type, intrinsic, and to P type along the course of CVD processing). The composition of the diode in one embodiment can be an intrinsic layer between the P and N type silicon, the so-called p-i-n diode. The intrinsic layer means there is no intention to add any dopants but it could be slightly N or P type due to out diffusion or contamination. The thickness of the intrinsic layer determines the breakdown voltage of the diode and shall be high enough to prevent premature programming. Another embodiment to control the breakdown voltage of the diode is to use lesser doped N or P type, rather than intrinsic, in between the heavily doped P and N terminals of the diode. The thickness of the diode is about 3,000-5,000 Å to fit into the contact height. Alternatively, the p-i-n diode can be fabricated from depositing silicon and then followed by implanting N or P type dopants in different steps. FIG. 5(e) shows after a thin layer of oxide 67 is deposited as an anti-fuse film after the formation of the P and N portions of the diode 66. The dielectric film can be fabricated from silicon dioxide ($SiO_2$), silicon nitride ($Si_3N_4$), silicon oxide-nitride (SON), or silicon oxide-nitride-oxide (ONO). Alternatively other types of metal oxides, such as $Al_2O_3$, $HfO_2$, $ZrO_2$, or $Cr_2O_3$, can be used. If $SiO_2$ is used, the thickness is generally around 30-80 Å to have breakdown voltage about 6-15V. The oxide for breakdown 67 can also be fabricated before or inserted between the P, intrinsic, or N portions of the diode 66. FIG. 5(f) shows after another adhesive layer 68 is deposited. FIG. 5(g) shows after a metal layer 69 is deposited, patterned, and etched. The metal layer 69 serves as the bitline running in the Y-direction. In this embodiment, one additional mask is needed to open contact holes, build p-i-n or P/N silicon diode, grow oxide inside the contact holes. The adhesive layers serve to provide better attachment between metal and different materials in the contact holes that can be one, two, or none.

Embodiments as illustrated in FIGS. 4, 5(a)-5(g) are about anti-fuses defined by metal and polysilicon lines. There are some embodiments about building an oxide film external to a p-i-n diode or between P and N terminals of a diode. The required processing steps are about the same. But the breakdown mechanism in p-i-n diode is an oxide breakdown between silicon and metal, while the breakdown mechanism in the p-oxide-n sandwich structure is an oxide breakdown between P and N type silicon. Breaking down between silicon and metal may be more reliable than the mechanism between P and N types of silicon. Therefore, a p-i-n diode is a more desirable embodiment over a P-oxide-N sandwich structure.

Polysilicon lines can be readily replaced by active region lines while the other perpendicular conductor lines are metal in other embodiment, which can be anti-fuse cells having a p-i-n diode with external oxide film or having a p-oxide-n sandwich structure. FIG. 4 and FIG. 5(a)-5(g) can be readily applied with the polysilicon lines replaced by active region lines. Using polysilicon lines, rather than active region lines, as wordlines allows them to be biased at a negative voltage, since the wordlines are isolated by oxidation rather than P/N junctions.

Figure 6:
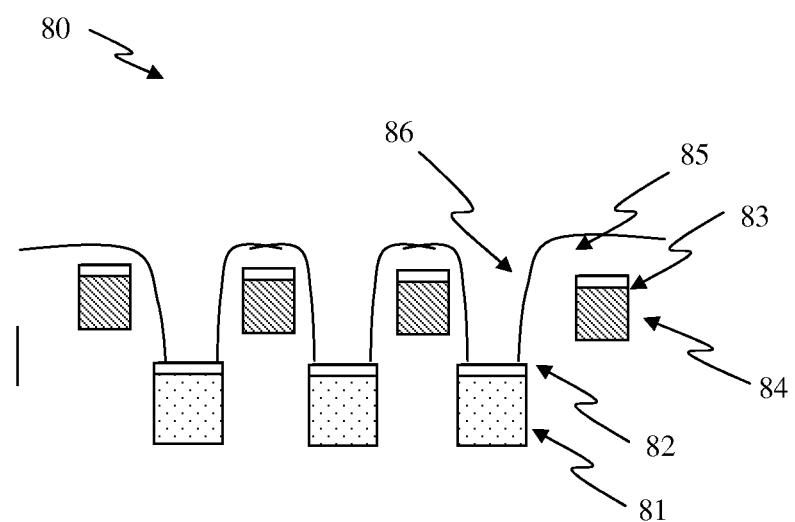
FIG. 6 shows using dummy polysilicon to raise contact-hole height in an anti-fuse defined by metal and active lines.

However, anti-fuse cells defined by metal and active region lines in other embodiments allow variations in adjusting contact height by placing dummy polysilicon between active regions on the field. FIG. 6 shows a cross section 80 of anti-fuse cells defined by metal and active lines. Active region lines 81 are built and grown with silicide 82 on top. Dummy polysilicon lines 84 with silicide 83 on top are placed between active region lines, but on the field oxide. Because of the dummy polysilicon, the height of the interlayer dielectric 85 to the silicon surface is raised by the thickness of the polysilicon, or about 2,000-5,000 Å, so is the height of contact holes. This allows more depth to build p-i-n diode or p-oxide-n sandwich structure inside a contact hole 86, and hence provides one more parameter for optimization.

Figure 7:
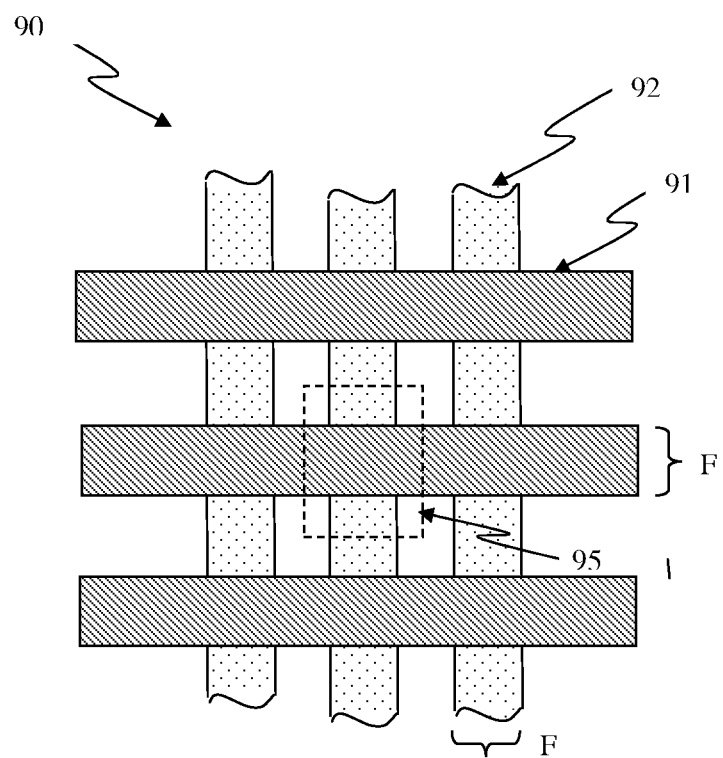
FIG. 7 shows a top view of dielectric breakdown anti-fuse defined by active and polysilicon lines according to one embodiment.

FIG. 7 shows a top view of dielectric breakdown anti-fuse cells 90 defined by active lines 92 and polysilicon lines 91 according to one embodiment. At the junctions of polysilicon 91 and active region 92 build anti-fuse cells 95. The polysilicon 91 lines are blocked spacers on each side so that the memory cell size can be smaller. The spacer is a technique to allow forming a lightly-doped source/drain (LDD) region near the gate to alleviate the short channel effects. The cell size is determined by active region pitch in the X-direction and polysilicon pitch in the Y-direction so that the cell size is $4F^2$. The active lines 92 can be doped with N type dopant and the polysilicon lines 91 can be doped with P type dopant so that a diode can be created after the oxide layer is broken down. The active lines 92 can also be doped with P type dopant after being doped with the N type dopant to form an explicit diode before fabricating an oxide layer. Similarly, the active lines 92 can be doped with an intrinsic layer after doped with the N type dopant and before fabricating the oxide layer to create a p-i-n diode after the oxide is broken down.

Figure 8A:
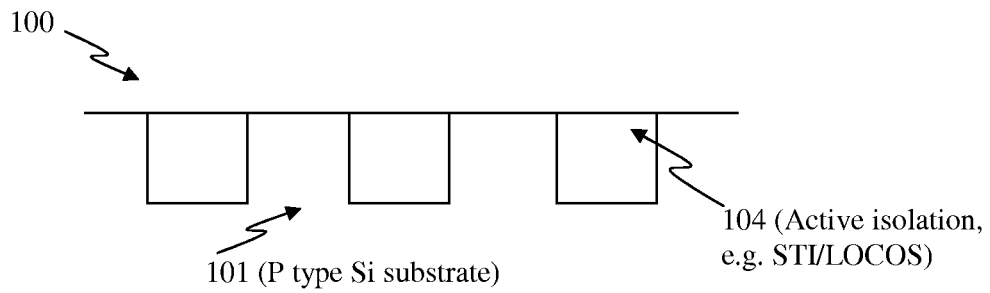
FIG. 8(a) shows step (a) of fabricating a dielectric breakdown anti-fuse defined by active and polysilicon (ref. to FIG. 7) after building active isolation (e.g. STI/LOCOS).
Figure 8B:
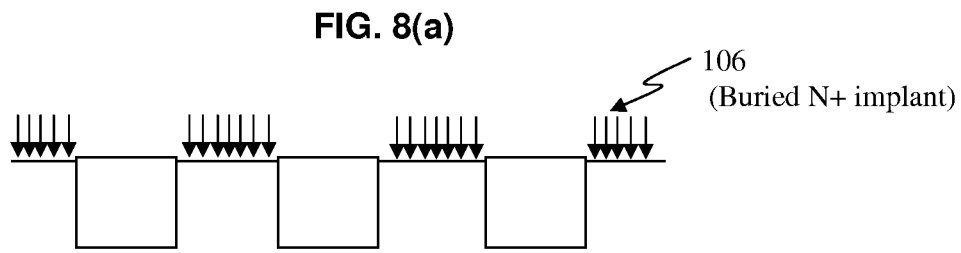
FIG. 8(b) shows step (a) of fabricating a dielectric breakdown anti-fuse defined by active and polysilicon (ref. to FIG. 7) after buried N+ implant.
Figure 8C:
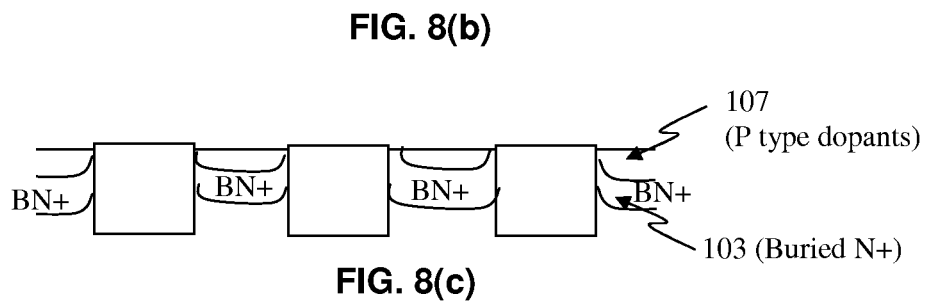
FIG. 8(c) shows step (a) of fabricating a dielectric breakdown anti-fuse defined by active and polysilicon (ref. to FIG. 7) after growing intrinsic and P type silicon.
Figure 8D:
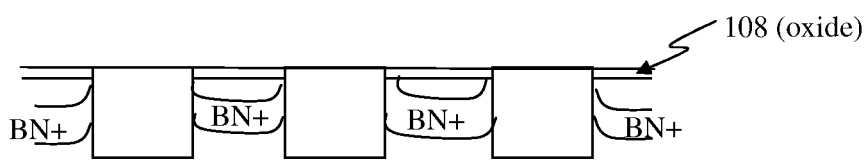
FIG. 8(d) shows step (a) of fabricating a dielectric breakdown anti-fuse defined by active and polysilicon (ref. to FIG. 7) after growing oxide.
Figure 8E:
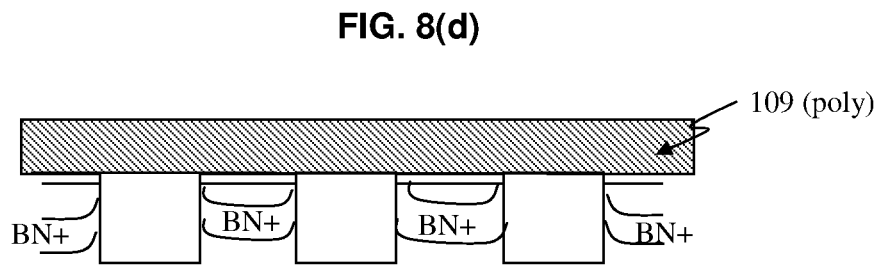
FIG. 8(e) shows step (a) of fabricating a dielectric breakdown anti-fuse defined by active and polysilicon (ref. to FIG. 7) after depositing and etching polysilicon.

FIGS. 8(a)-8(e) show cross sections 100 in a portion of process steps related to dielectric breakdown anti-fuse cells defined by active region and polysilicon lines in FIG. 7. In this embodiment, the gate oxide between active and polysilicon acts as an anti-fuse for rupture. The cross sections are along the X-direction. FIG. 8(a) shows a cross section after active isolation, such as LOCOS or STI 104, is built on a P type substrate 101 according to standard CMOS processes. Then, the surface is implanted by N+ 106 to create buried N+ lines to serve as bitlines in FIG. 8(b). The buried N+ lines tend to be heavily N+ doped in the bottom and slightly lighter doped near the surface and may have silicide on top to reduce bitline resistance. They tend to be strapped by metal in fixed intervals to further reduce the resistance. FIG. 8(c) shows a cross section after a P type implant 107 is introduced. The P type dopant and the buried N+ constitute a P/N junction diode. FIG. 8(d) shows a cross section after a thin layer of oxide 108 as dielectric is deposited or grown. Then, a polysilicon 109 is deposited, patterned, implanted by P+, and etched to serve as wordlines of the anti-fuse cells, running in the X-direction in FIG. 8(e). The polysilicon 109 may be silicided to reduce resistance but is blocked spacers on each side so that memory cell can be smaller. The rest of process steps follow the standard CMOS processes. With a proper voltage applied between buried N+ and polysilicon lines, the gate oxide can be rupture so that at the cross-point of the polysilicon and buried N+ lines acts as the P and N terminals of a diode. One additional mask may be needed to build buried N+ lines with heavy N+ implant.

One of the embodiments is to eliminate the P type dopant. Without explicit P type implant to build a P/N junction diode in FIG. 8(c), an implicit diode, constructed from P type polysilicon and N type buried lines, may still be created after the oxide is ruptured. Another embodiment is to fabricate an intrinsic layer before the P type dopant on the silicon surface to create a p-i-n diode. Intrinsic means no intentionally N or P doped but can be slightly N or P type due to out-diffusion or contamination. Yet another embodiment is to fabricate an intrinsic layer without any P type dopant on the silicon surface before an oxide is fabricated and a polysilicon is deposited. The step to grow or deposit oxide 108 in FIG. 8(d) may be omitted by sharing the gate oxide growing process in standard CMOS processes. These are many variations to build an implicit or explicit P/N junction diodes at the cross points in other embodiments.

Figure 9:
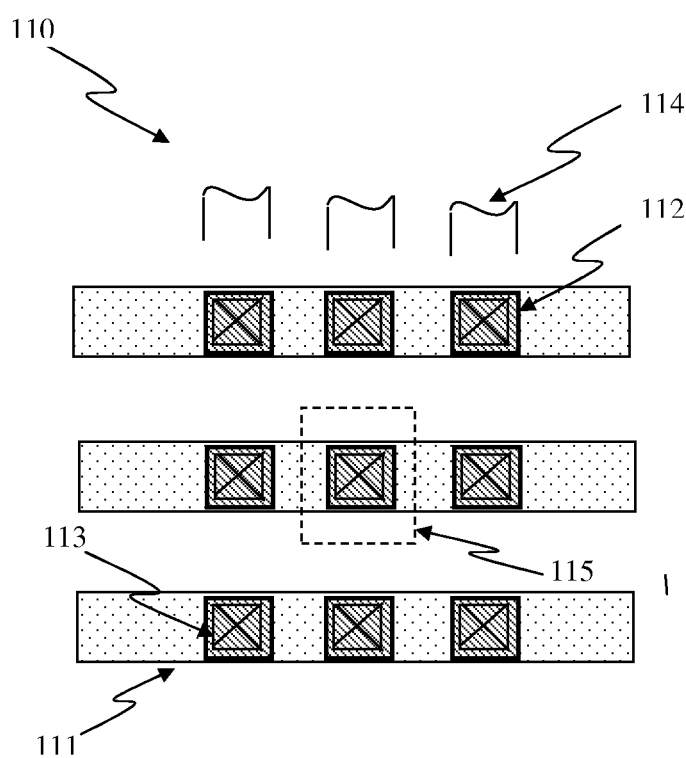
FIG. 9 shows a top view of fabricating a dielectric breakdown anti-fuse defined by active region and metal with a piece of polysilicon at each cross-point.

FIG. 9 shows a top view of dielectric breakdown anti-fuse cells 110 defined by active lines 111 and metal lines 114 with a piece of polysilicon 112 at the cross-point in according to 5one embodiment. At the junction of metal 114 and active region 111 builds an anti-fuse cell 115, where the polysilicon and active region serves as the P and N terminals of a diode. The cell size is determined by active region pitch in the X-direction and metal or polysilicon pitch in the Y-direction so that the cell size is $4F^2$.

Figure 10A:
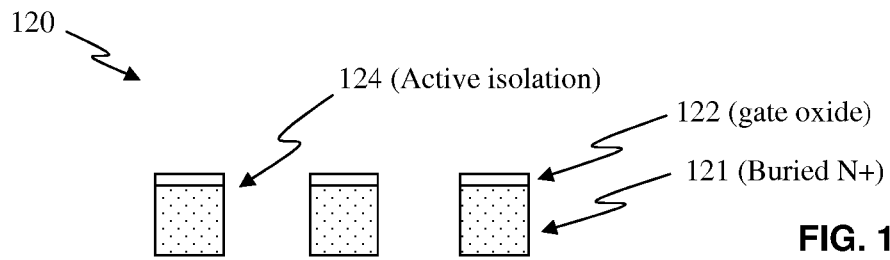
FIG. 10(a) shows step (a) of fabricating a dielectric breakdown anti-fuse defined by active and metal (ref.
Figure 10B:
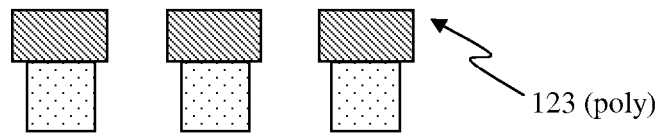
FIG. 10(b) shows step (b) of fabricating a dielectric-breakdown anti-fuse defined by active and metal (ref.
Figure 10C:
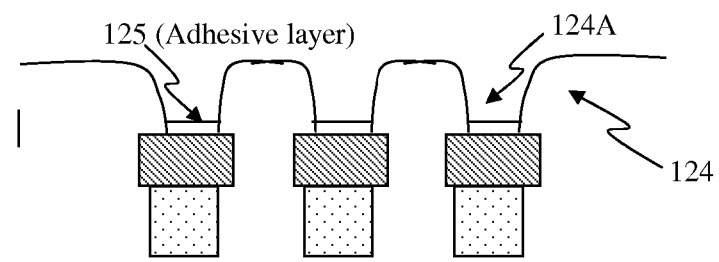
FIG. 10(c) shows step (c) of fabricating a dielectric-breakdown anti-fuse defined by active and metal (ref.
Figure 10D:
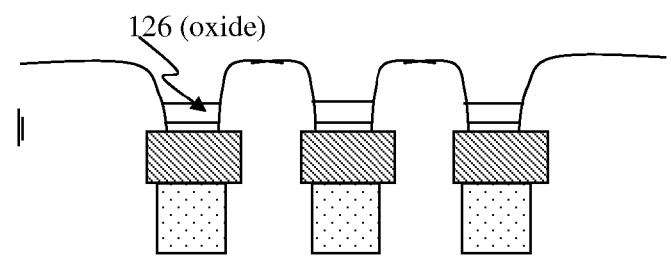
FIG. 10(d) shows step (d) of fabricating a dielectric-breakdown anti-fuse defined by active and metal (ref.
Figure 10E:
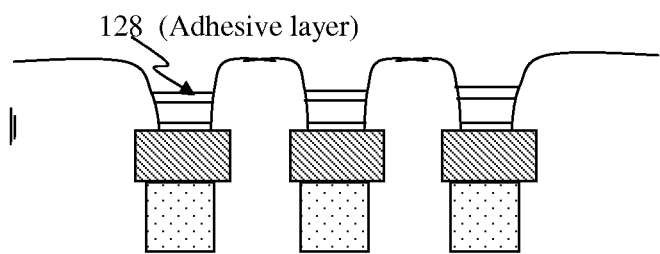
FIG. 10(e): shows step (e) of fabricating a dielectric-breakdown anti-fuse defined by active and metal (ref.
Figure 10F:
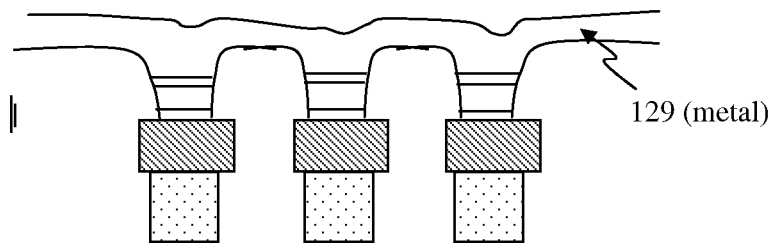
FIG. 10(f): shows step (f) of fabricating a dielectric-breakdown anti-fuse defined by active and metal (ref.

FIGS. 10(a)-10(f) show cross sections 120 in a portion of process steps related to the dielectric breakdown anti-fuse cells defined by active and metal with a piece of polysilicon in each contact hole as shown in FIG. 9. In this embodiment, a diode constructed from a polysilicon patch and an active line is formed after the gate oxide is stripped. An oxide film is then grown or deposited inside the contact holes. The cross sections are along the Y-direction. FIG. 10(a) shows a cross section after N type active lines 121 are built and gate oxide 122 is grown on top of a silicon substrate. The active lines interconnect the cells in the X-direction, and serve as bitlines. FIG. 10(b) shows after the gate oxide is striped and pieces of polysilicon 123 are built over the active regions. The polysilicon is P type and the active is N type so that a diode is built as program selector in an anti-fuse cell. FIG. 10(c) shows after an interlayer dielectric 124 is deposited, contact holes 124A are etched, and a thin adhesive layer 125 is deposited. FIG. 10(d) shows after an oxide film 126 is fabricated. The oxide film, such as $SiO_2$, $Si_3N_4$, $SiN_X$, silicon oxide-nitride (SON), silicon oxide-nitride-oxide (ONO), or other types of metal oxide, can be deposited or grown by oxidation or deposit. The thickness of the oxide layer determines the breakdown voltage of the anti-fuse for programming. If $SiO_2$ is employed, the thickness is generally around 30-80 Å to have breakdown voltage about 6-15V. FIG. 10(e) shows after another adhesive layer 128 is deposited. FIG. 10(f) shows after a metal layer 129 is deposited, patterned, and etched. The metal serves as a bitline running in the Y-direction. In this embodiment, two additional masks are needed to strip the gate oxide and open contact holes for building diodes and an oxide film. The gate oxide strip mask can be shared in a CMOS process that offers more than one kind of gate-oxide devices. The adhesive layers serve to have better attachment between different materials to metal in the contact holes such that the adhesive layer number can be one, two, or none.

Though the anti-fuse can be fabricated in a few more masks over the standard CMOS process, more masks may be needed to fabricate high voltage devices in the peripheral circuit considering the programming voltage tend to be very high, about 10-15V. As a rule of thumb, the rupture voltage for a $SiO_2$ film is 2V for every 10 Å. For example, the breakdown voltage for a 30 Å $SiO_2$ film is about 6V. Reducing the thickness of the dielectric film can lower the program voltage so that high voltage devices are not needed in the peripheral circuits. Novel half-select schemes also help to alleviate the requirements of using high voltage devices so that the core logic or I/O devices in the other parts of the integrated circuit can be used for embedded applications.

Figure 11A:
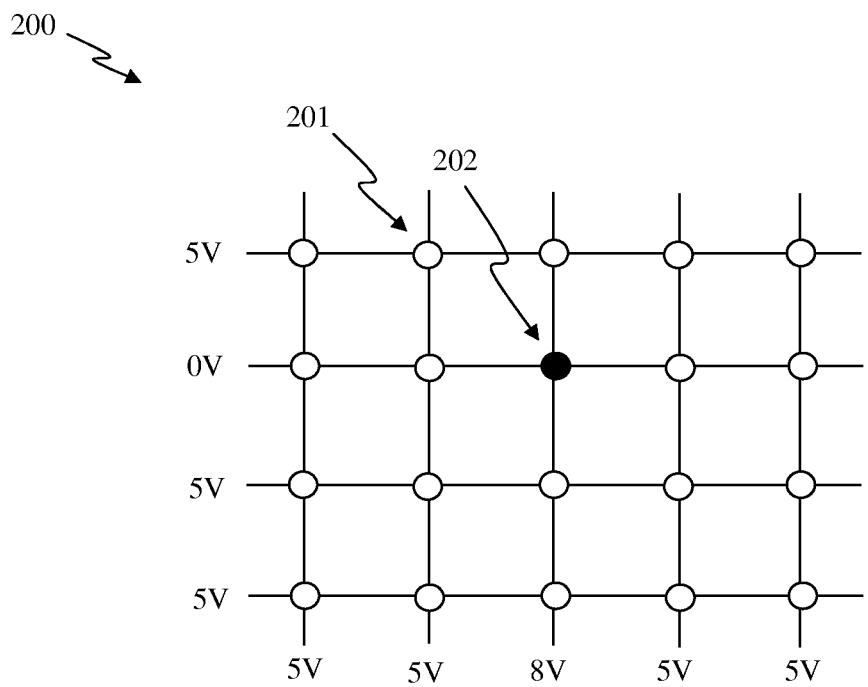
FIG. 11(a) shows one high voltage and one core logic or I/O voltage voltages applied to the perpendicular conductors to the selected and unselected cells according to one embodiment.

FIG. 11(a) shows one embodiment of a 4×5 anti-fuse array 200 to alleviate the requirements for high voltage supplies in the peripheral. Suppose the supply voltage of the peripheral and the rest of integrated circuit is 5V, while the program voltage for anti-fuse is 8V, the voltage swings for two perpendicular conductors are 0-5V, and 5-8V, respectively. The selected cell 202 has 0V in the horizontal line and 8V in the vertical line so that the resultant voltage at the cross point is 8V to program the selected cell. However, for those unselect cells, the voltage across the cell is either 5V, or 3V so that no programming could happen. The 8V program voltage is low enough for the peripheral devices to sustain over the maximum programming time. By doing this way, not only high voltage devices are not necessary but also the internal voltage generators. This cell select scheme does not require any negative voltages that may need additional masks to isolate NMOS from a P substrate.

Figure 11B:
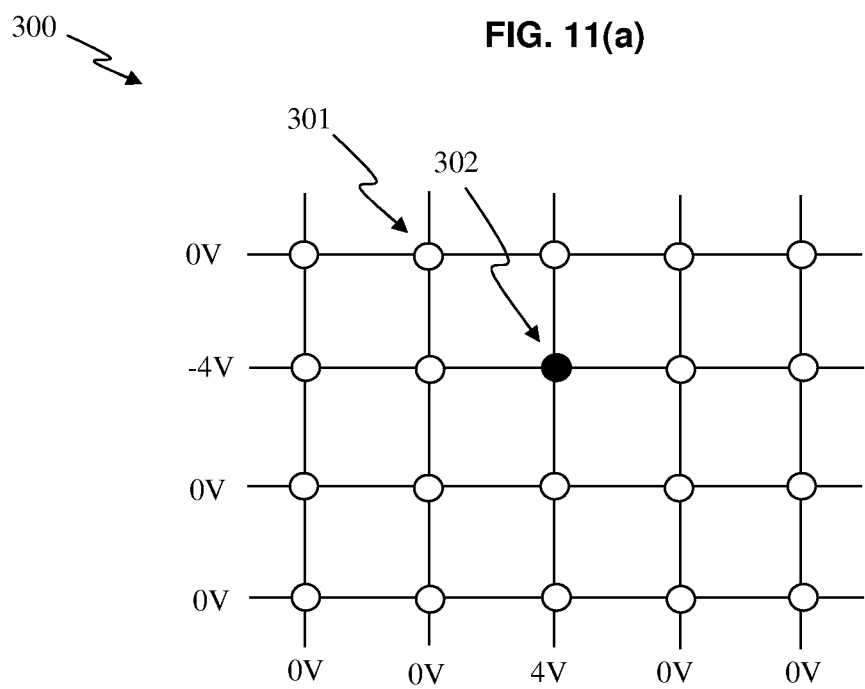
FIG. 11(b) shows positive and negative supply voltages applied to the perpendicular conductors to the selected and unselected cells according to one embodiment.

FIG. 11(b) shows another embodiment of a 4×5 anti-fuse array 300 to alleviate the requirements for high voltage supplies in the peripheral. Suppose the supply voltage of the peripheral and the rest of integrated circuit is 4V, while the program voltage for anti-fuse is 8V, the voltage swings for two perpendicular conductors are 0-4V, and −4-0V, respectively. The selected cell 302 has −4V in the horizontal line and 4V in the vertical line so that the resultant voltage at the cross point is 8V to program the cell. However, for those unselect cells, the voltage across the cell is either −4V, or 4V so that no programming could happen. If the 8V program voltage is too high for the peripheral devices to sustain, this combination of positive and negative supply is a desirable embodiment. By doing this way, not only high voltage devices are not necessary but also the internal voltage generators. This cell select scheme requires a negative voltage supply that may need additional masks to isolate NMOS from a P substrate.

Figure 11C:
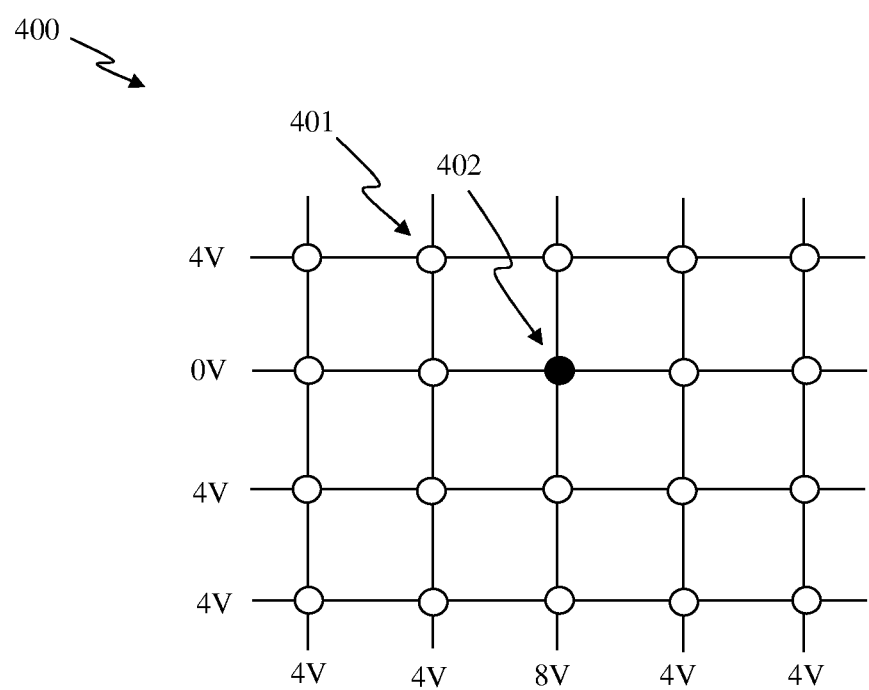
FIG. 11(c) shows a high and a half-value program supply voltages applied to the perpendicular conductors to the selected and unselected cells according to one embodiment.

FIG. 11(c) shows another half-select scheme 400 by swinging the row and column voltages between 0 to 4V. For a selective cell 402, the voltage applied to the column is 8V while the voltage to the row is 0V, so that the resulting voltage drop on the cell 402 is 8V for programming. On the other hand, the unselected cell 401 has either both 4V's on the rows and columns, or one 4V and the other 0V on row or column, so that the resulting voltage drop is either 4V or 0V to prevent from programming. In this scheme, a voltage generator to generate half of the program voltage may be needed.

There are many variations in the embodiments of this invention. For example, the substrate can be N type rather than P type through the above discussions. The N type or P type dopant can be reversed so that a p-i-n diode and n-i-p diode can be considered equivalent. So are the p-oxide-n and the n-oxide-p sandwich structures. Some process steps may be omitted, such as adhesive layers. And the order of fabricating oxide film and p-i-n or P/N diode may be reversed. The dielectric film for rupture can be fabricated before, after, or in between P type and N type of the diode. The polysilicon and active may not be silicided in an older process. For those skilled in the art understand that various embodiments are possible and they are still within the scope of this invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An anti-fuse memory in an integrated circuit, comprises:
   a plurality of anti-fuse cells, at least one of the cells being constructed at the cross points of:
      a plurality of conductive lines, the conductive lines being polysilicon lines;
      a plurality of metal lines being substantially perpendicular to the conductive lines;
      a layer of isolation oxide fabricated between the metal lines and the conductive lines;
      a plurality of contacts holes at the cross points of the metal lines and the conductive lines; and
      a silicon diode and a layer of thin oxide fabricated in at least one of the contact holes before placing the metal lines, the layer of thin oxide being provided over the silicon diode between the silicon diode and at least one of the metal lines;
   wherein the anti-fuse memory is configured to be selectively programmable by applying a first supply voltage to the metal lines and a second supply voltage to the conductive lines to rupture the thin oxide.

2. An anti-fuse memory as recited in claim 1, wherein the conductive lines are active region lines with an implant before CMOS source/drain implants.

3. An anti-fuse memory as recited in claim 1, wherein the layer of thin oxide is fabricated after the silicon diode is fabricated in the at least one of the contact hole.

4. An anti-fuse memory as recited in claim 1, wherein the layer of thin oxide is fabricated between the first and second portions of the silicon diode in at least one of the contact holes, where the first and second portions of the silicon diode have different types of dopants that serve as the P and N terminals of the silicon diode.

5. An anti-fuse memory as recited in claim 1, wherein the layer of thin oxide comprises a silicon dioxide ($SiO_2$), silicon nitride ($SiN_x$), silicon oxide-nitride (SON), silicon oxide-nitride (SON), silicon oxide-nitride-oxide (ONO), or any metal oxide.

6. An anti-fuse memory as recited in claim 1, wherein the thickness of the layer of thin oxide in the at least one of the contact holes is less than 50 Å.

7. An anti-fuse memory as recited in claim 1,
   wherein the layer of thin oxide is fabricated between first and second portions of the silicon diode in at least one of the contact holes, where the first and second portions of the silicon diode have different types of dopants that serve as the P and N terminals of the silicon diode, and
   wherein the thickness of the layer of thin oxide in each of the contact holes is less than 50 Å.

8. An anti-fuse memory as recited in claim 1, wherein the conductive lines are active region lines with an implant before CMOS source/drain implants.

9. An anti-fuse memory as recited in claim 1, wherein the layer of thin oxide is fabricated after the silicon diode is fabricated in the at least one of the contact holes.

10. An anti-fuse memory as recited in claim 9, wherein the layer of thin oxide is fabricated between first and second portions of the silicon diode in at least one of the contact holes, where the first and second portions of the silicon diode have different types of dopants that serve as the P and N terminals of the silicon diode.

11. An anti-fuse memory as recited in claim 10, wherein the layer of thin oxide comprises a silicon dioxide ($SiO_2$), silicon nitride ($SiN_x$), silicon oxide-nitride (SON), silicon oxide-nitride-oxide (ONO), or any metal oxide.

12. An anti-fuse memory as recited in claim 9, wherein the thickness of the layer of thin oxide in the at least one of the contact holes is less than 50 Å.

13. An anti-fuse memory as recited in claim 1, wherein devices in a peripheral portion of the anti-fuse memory are built from the same as core logic or 1/O devices in another part of the integrated circuit.

14. An electronic system, comprises:
   at least one battery; and
   an integrated circuit operatively connected to the at least one battery, the integrated circuit including at least an anti-fuse memory comprising a plurality of anti-fuse cells, each of at least the plurality of the anti-fuse cells being constructed at one of the cross points and each of at least the plurality of anti-fuse cells includes at least:
   a plurality of conductive polysilicon lines with a first type of dopant;
   a plurality of metal lines being substantially perpendicular to the conductive polysilicon lines;
   a layer of isolation oxide fabricated between the metal and conductive polysilicon lines;
   a plurality of contact holes at the cross points of the metal and conductive polysilicon lines; and
   a silicon diode and a layer of thin oxide fabricated in at least one of the contact holes before placing the metal lines, the layer of thin oxide being provided over the silicon diode between the silicon diode and at least one of the metal lines,
   wherein the anti-fuse memory is configured to be selectively programmable by applying a first supply voltage to the metal lines and a second supply voltage to the polysilicon conductive lines to rupture a portion of the layer of thin oxide.

15. An electronic system as recited in claim 14, wherein devices formed in a peripheral portion of the anti-fuse memory are built from the same as core logic or I/O devices in another part of the integrated circuit.

16. An electronic system as recited in claim 14, wherein the polysilicon conductive lines are active region lines with an implant before CMOS source/drain implants.

17. An electronic system as recited in claim 14, wherein the layer of thin oxide is fabricated after the silicon diode is fabricated in each of the contact holes.

18. An electronic system as recited in claim 14, wherein the layer of thin oxide is fabricated between first and second portions of the silicon diode in at least one of the contact holes, where the first and second portions of the silicon diode have different types of dopants that serve as the P and N terminals of the silicon diode.

19. An electronic system as recited in claim 14, wherein the layer of thin oxide comprises a silicon dioxide ($SiO_2$), silicon nitride ($SiN_x$), silicon oxide-nitride (SON), silicon oxide-nitride-oxide (ONO), or any metal oxide.

20. An electronic system as recited in claim 14, wherein the thickness of the layer of thin oxide in each of the contact holes is less than 50 Å.

21. An electronic system as recited in claim 14, wherein the at least one battery provides a voltage between 1.0 and 2.0V in the nominal conditions.

\* \* \* \* \*